(12) United States Patent
Beckert et al.

(10) Patent No.: US 6,671,142 B2
(45) Date of Patent: Dec. 30, 2003

(54) CIRCUIT FOR OPERATING VOLTAGE RANGE EXTENSION FOR A RELAY

(75) Inventors: James J. Beckert, Elgin, IL (US); Paul A. Witt, Saint Charles, IL (US); Michael J. Roller, Oakwood Hills, IL (US)

(73) Assignee: Omron Corporation, Kyoto (JP)

( * ) Notice: Subject to any disclaimer, the term of this patent is extended or adjusted under 35 U.S.C. 154(b) by 305 days.

(21) Appl. No.: 09/915,802

(22) Filed: Jul. 26, 2001

(65) Prior Publication Data

US 2002/0118495 A1 Aug. 29, 2002

Related U.S. Application Data

(60) Provisional application No. 60/271,801, filed on Feb. 27, 2001.

(51) Int. Cl.[7] .............................. H02H 3/00; H02H 7/22
(52) U.S. Cl. ............................................. 361/2; 361/13
(58) Field of Search ........................ 361/2–9, 13, 91.1, 361/91.2, 91.3, 100, 101; 307/134, 137

(56) References Cited

U.S. PATENT DOCUMENTS

| | | | |
|---|---|---|---|
| 3,075,124 A | 1/1963 | Bagno | 317/11 |
| 3,184,619 A | 5/1965 | Zydney | 307/134 |
| 3,912,941 A | 10/1975 | Passarella | 307/136 |
| 4,250,531 A | 2/1981 | Ahrens | 361/2 |
| 4,438,472 A | 3/1984 | Woodworth | 361/13 |
| 4,745,511 A | 5/1988 | Kugelman et al. | 361/8 |
| 4,959,746 A | 9/1990 | Hongel | 361/13 |
| 5,081,558 A | * 1/1992 | Mahler | 361/13 |

* cited by examiner

Primary Examiner—Jessica Han
(74) Attorney, Agent, or Firm—Foley & Lardner (57) ABSTRACT

A relay is designed to be used in a circuit where the voltage levels are high in comparison to the spacing between the contacts when open. Contact closure arcing is suppressed by actuating a MOSFET that shorts the contacts together while they open. The same MOSFET can momentarily short the contacts together just before they first begin to close, allowing a test current to be passed through the MOSFET and through the terminals connecting to both relay contacts, to insure that arc suppression will be successful; and if this test fails, then the relay can be disabled by a switch in series with the relay coil to prevent arcing and a possible fire hazard. Relay deactuation can be sensed to trigger arc suppression, and relay actuation can be sensed to initiate fail-safe testing by a circuit that responds no matter which way the relay coil is connected into the external circuit that drives it.

39 Claims, 4 Drawing Sheets

CIRCUIT FOR OPERATING VOLTAGE RANGE EXTENSION FOR A RELAY

CROSS REFERENCE TO RELATED APPLICATIONS

This application is a non-provisional utility patent application relating to provisional application, Ser. No. 60/271,801, filed on Feb. 27, 2001.

BACKGROUND OF THE INVENTION

A. Field of the Invention

The present invention relates to relay contact protective circuits and, in particular, to fail-safe arc suppression control circuits that can protect relay contacts.

B. Description of the Related Art

A relay is used to perform automatic electrical switching. A relay typically comprises two parts: a coil and a magnetic switch. When an electrical current flows through the coil, a magnetic field is created in proportion to the current flow through the coil. At a predetermined point, the magnetic field is sufficiently strong to pull the switch's movable contact from its rest, or de-energized position, to its actuated, or energized position pressed against the switch's stationary contact. When the electrical power applied to the coil drops, the strength of the magnetic field drops, releasing the movable contact and allowing it to return to its original de-energized position. As the contacts of a relay are opened or closed, there is an electrical discharge called arcing, which may cause heating and burning of the contacts and typically results in degradation and eventual destruction of the contacts over time.

U.S. Pat. No. 3,912,941 to Passarella and U.S. Pat. No. 4,250,531 to Ahrens both teach an arc prevention circuit for relays that switch inductive loads. These circuits have the relay contacts drive a transistor amplifier which drives the load, thereby eliminating contact arcing induced by inductive voltage transients. But contact arcing can still occur. Also, the transistor amplifier, which is not a perfect switch, must be designed to dissipate heat, and it is heated the entire time the load is supplied with current. Thus, a large power transistor with elaborate heat sinking may have to be provided. Except in low power, low voltage situations, this is not a satisfactory solution.

U.S. Pat. No. 3,075,124 teaches inserting a semiconductor device in series with the relay contacts to suppress arcing, but such an arrangement also introduces the resistance of the semiconductor device into the load current flow path, causing excessive heating of the semiconductor device. This arrangement also cannot suppress all arcing, and it is dependent upon some minimal arcing to place its arc suppression mechanism into operation.

U.S. Pat. No. 3,184,619 to Zydney and U.S. Pat. No. 4,438,472 to Woodworth both teach a suppression circuit that momentarily shorts the relay contact with a transistor switch. But because the switch is not actuated before the contacts open, there is still the possibility of contact arcing with this arrangement.

U.S. Pat. No. 4,745,511 by Kugelman shorts the contacts momentarily with a MOSFET from the moment when the relay coil is first actuated until sometime after the contacts have opened, but this arrangement requires extra power supply connections and thus cannot be built into a relay without the addition of extra power supply pins to the relay housing. This arrangement also suppresses contact closure arcing, but that can be helpful to keep the contacts clean and operative.

U.S. Pat. No. 4,959,746 by Hongel teaches using an electronic MOSFET shunting switch triggered by actuation and deactuation of the relay coil to relieve both contact closure and contact opening arcing. However, Hongel does not teach designing such a system that permits flexibility in how the relay coil is driven by external circuitry. He also does not teach how such a system can be made fail safe for use with potentially destructive high voltages relative to contact spacing. There is no "fail safe" arrangement in Hongel's designs.

Thus, there is a need for a simplified and improved relay contact protective circuit that can be built into a standard relay housing without the need for extra power supply connections and with minimal impact upon the flexibility of relay utilization, particularly in the case of high voltages and close contact spacing.

SUMMARY OF THE INVENTION

The present invention provides improved functionality and reduced complexity for an electronic relay switch, and it permits lower voltage relays to be used in high voltage systems. Arc suppression is provided during the "breaking" of the circuit, and the arc suppression mechanism is verified before the relay is permitted to operate to avoid damage to the contacts and possible fire hazards. When an undesirable condition is detected, operation of the relay is prevented. In addition to avoiding damage to the contacts, damage to circuit components is prevented. In one embodiment, provision is made for full operability even when the relay coil connections are reversed.

Briefly summarized, the present invention may be characterized as a method for safely suppressing the arcing of a relay's contacts when the contacts open using a solid state switch connected in parallel with the relay's contacts as an arc suppressing device. This method comprises the steps of sensing the relay coil energization signal before its contacts close, and in response, energizing the solid state switch to short the relay contacts together. Then one tests whether the potential across the relay's contacts drops to a very low potential in response to this energization of the solid state switch before the relay's contacts close. If the potential across the relay's contacts is not very low, then one prevents energization of the relay coil and subsequent coil at least until contact closure energization terminates; but if the potential across the relay's contacts is very low, then one permits energization of the relay coil and subsequent contact closure, and one then senses deenergization of the relay before its contacts open, and in response, energizes the solid state switch again to short the relay contacts together long enough to suppress arcing that would otherwise occur when the relay's contacts open.

The energizing of the solid state switch in response to sensing energization of the relay before its contacts close can be a brief enough energization such that some contact closure arcing is permitted to occur to keep the contacts in good condition. The method may also include the steps of permitting energization of the relay whenever its contacts are closed, and preventing energization of the relay whenever its contacts are open, but permitting energization of the relay for a brief time, long enough to permit the contact closure, after the testing described above determines the potential across the solid state switch connected in parallel with the relay's contacts is very low. The steps of sensing energization or deenergization of the relay may be carried out by sensing a potential change at whichever end of the relay's coil is free to change its potential in response to an incoming energization signal, such that the method works regardless of which end of the coil of the relay may be connected to a fixed potential.

The invention may also be characterized as an arc suppression system for a relay having at least one pair of normally open contacts, having an energizing coil with at least two leads, and having at least two contact terminals and two coil terminals respectively electrically coupled to each of the contacts and to each of the coil leads. This system comprises a solid state contact shorting switch having two switch leads connected in parallel with the two contact terminals and having a control lead which, when energized with an input signal, causes the switch to effectively short circuit the two contacts of the relay. It further comprises a first timing pulse generator receiving an input signal from at least one of the two coil terminals and responding to a coil energizing signal by generating a first timing pulse which, when applied to the solid state switch's control lead, causes momentary conduction of the switch. It also comprises a circuit tester and coil switch having an input coupled to at least one of the two contact terminals independently of the switch leads of said solid state switch and arranged to signal, by its conductive or nonconductive state, whether the two relay contacts are or are not effectively short circuited by the solid state switch, this coil switch having two switch leads which form an electrically conductive part of one of the two electrical couplings between the coil leads and the coil terminals, such that the coil cannot be energized to close the relay contacts unless the coil switch first verifies the proper operation of the contact shorting switch and its connections to the contact terminals. Also, it further comprises a second timing pulse generator receiving an input signal from at least one of the two coil terminals and responding to the termination of a coil energizing signal by generating a second timing pulse which, when applied to the solid state switch's control lead, causes conduction of the contact shorting switch of sufficient duration to suppress contact opening arcing. The first timing pulse generator may generate a timing pulse of such short duration that some contact closure arcing is permitted to occur, and the circuit tester and coil switch may include a time delay that maintains the coil switch conductive after it is first rendered conductive for sufficient time so that it remains conductive during any brief moment when the contacts are not fully closed following the opening of the contact shorting switch after the circuit testing is completed.

The two timing pulse generators may include inputs connecting to both coil terminals to sense commencement and termination of energization signals regardless of which end of the coil may not be free to fluctuate in potential.

The invention may also be characterized as a fail-safe arc suppression system for a relay whose contacts are subjected to voltages that are high relative to the relay's maximum open contact separation distance, thereby creating a risk of possible sustained arcing if contact opening arcing is not carefully and fully suppressed. This system comprises a relay having an energizing coil having first and second coil leads respectively electrically coupled to first and second relay coil terminals of the relay and having at least first and second normally open relay contacts respectively electrically coupled to first and second relay contact terminals of the relay, the relay contacts arranged to close upon energization of the energizing coil and arranged to open in response to deenergization of the energizing coil. It also comprises a first solid state switch having a first switch control lead and having first and second switch leads, the first and second switch leads being coupled electrically respectively to the first and second relay contact terminals such that energization of the control lead causes the switch to effectively short circuit the relay contacts. In addition, it comprises a second solid state switch having a second switch control lead and having first and second switch leads that form part of the electrical coupling between at least one coil lead and its respective coil terminal such that a signal applied to the second switch control lead can permit or block the energization of the relay coil, said second switch control lead being electrically coupled to the one of said contact terminals that is intended to be connected to a load such that when the contact terminals are effectively short circuited, a signal is applied to the second switch control lead that permits the relay coil to be energized. It further comprises a circuit having at least one input electrically coupled to at least one of said first and second coil terminals and having an output electrically coupled to said first solid state switch's control lead, with this said circuit responding to a signal change at the circuit's input in a direction signaling the removal of energy from said energizing coil by applying a first timing signal pulse having a first pulse duration to the first solid state switch control lead, the first pulse's duration being sufficiently long to cause the first solid state switch to effectively short circuit the relay contacts while they open to suppress contact closure arcing; and with this circuit responding to a signal change at the circuit's input in a direction signaling the application of energy to said energizing coil by applying a pulse to the first solid state switch of sufficient duration to permit the second solid state switch to test for proper operation of said first solid state switch and its electrical coupling to the relay contact terminals before permitting the relay coil to be energized.

This system may include two timing signal pulse generators: one that responds to a signal fluctuation that indicates cessation of the coil energization signal by generating a pulse of sufficient time duration to permit full arc suppression during contact opening; and the other that responds to a signal fluctuation that indicates commencement of the coil energization signal by generating a pulse of short enough time duration to permit some contact closure arcing to occur if the circuit testing indicates that all is well and permits the relay coil to be energized to close the contacts. The circuit also may have two inputs, one from either coil terminal, such that it can always detect fluctuations of the coil energization signal regardless of which end of the coil may not be free to fluctuate in any given circuit configuration.

The invention may also be characterized as an arc suppression system for a relay having at least one pair of normally open contacts, having an energizing coil with at least two leads, and having at least two contact terminals and two coil terminals respectively electrically coupled to each of the contacts and to each of the coil leads, which also comprises a solid state contact shorting switch having two switch leads connected in parallel to the two contact terminals and having a control lead which, when energized with an input signal, causes said switch to effectively short circuit the two contacts of the relay, and a timing pulse generator having two inputs receiving input signals respectively from both of the two coil terminals and responding to a signal fluctuation at either of the coil terminals in a direction indicating a cessation of an incoming relay energizing signal by causing conduction of the contact shorting switch of sufficient duration to suppress contact opening arcing. The timing pulse generator may be designed to respond to signal fluctuations at either of the coil terminals in a direction indicating commencement of a relay energization signal by permitting at least a short duration of no arc suppression activity at contact closure time so that some amount of contact closure arcing is permitted to occur. And the timing pulse generator may also be designed to respond to signal fluctuations at either of the coil terminals in a direction indicating commencement of a relay energization signal by momentarily causing the contact shorting switch to short the relay contacts. During this brief shorting of the relay contacts, other test circuits cam be called upon to test the integrity of the contact shorting switch and the coupling of its switch leads to the contact terminals by measuring the degree to which the contact shorting switch is able to short the relay contacts, the test circuit preventing actuation of the relay if there is any doubt about the ability of the contact shorting switch to suppress contact opening arcing.

The invention further may be found in a relay that has a pair of normally-open relay contacts electrically coupled to pair of contact terminals, a relay coil magnetically coupled to at least one of the pair of relay contacts and arranged to close the pair of relay contacts when supplied with current with the coil having first and second leads, a pair of coil terminals electrically coupled to the respective coil leads, a solid state switch having a pair of switch leads electrically coupled to the respective contact terminals, the switch also having a control lead, a timing circuit having first and second signal inputs and first and second power inputs and having a signal output electrically coupled to the switch control lead with the timing circuit providing a timed output signal pulse at its signal output in response to signal transitions at either of its signal inputs, first and second electrical power couplings interconnecting the respective first and second power inputs to at least one of the coil or contact terminals with at least one of the first and second electrical power couplings interconnecting the corresponding one of the first and second power supply inputs either to both of the coil terminals or to both of the contact terminals through diodes or their equivalents, and first and second signal supply couplings interconnecting the respective first and second signal inputs to the respective coil terminals to thereby permit the timing circuit to respond to signal fluctuations on either coil terminal.

At least one of the first and second electrical power couplings may interconnect the corresponding one of the first and second power supply inputs to both of the coil terminals. And more specifically, the first electrical power coupling may interconnect the first power supply input to both of the coil terminals through diodes or their equivalents, and the second electrical power supply coupling may interconnect the second power supply input to one of the contact terminals.

Alternatively, the relay may comprise a pair of normally-open relay contacts, first and second contact terminals electrically coupled to the respective relay contacts in said pair of contacts, a relay coil magnetically coupled to at least one of the pair of relay contacts and arranged to close the pair of relay contacts when supplied with current with the coil having first and second leads, first and second coil terminals, with the first coil terminal electrically coupled to the first lead, a first solid state switch electrically coupling the second coil lead to said second coil terminal and having a first control lead, a second solid state switch having first and second switch leads and having a second control lead, first and second contact terminal electrical couplings respectively connecting the first and second switch leads to the first and second contact terminals, a timing circuit having first and second signal inputs and first and second power inputs and having a signal output electrically coupled to the second control lead with the timing circuit providing a timed output signal pulse at its signal output in response to signal transitions of a first polarity received at its first signal input and in response to signal transitions of a second polarity received at its second signal input, first and second electrical power couplings connecting the respective first and second power inputs to at least one of the coil or contact terminals, first and second signal supply couplings connecting the respective first and second signal inputs to the second coil terminal, and a circuit test electrical coupling connecting the second contact terminal to the first control lead, this circuit test electrical coupling being electrically isolated from the second contact terminal electrical coupling such that a test signal flowing from the second switch lead of the second solid state switch to the first control lead of the first switch must pass into and out of the second contact terminal.

In addition, the relay may include a printed circuit board having openings through which all of the terminals extend, and some or all of the electrical interconnections between the first and second switches and the contact and coil terminals may be formed by foil current paths formed on the surface of the printed circuit board and electrically engaging the first and second contact terminals and the second coil terminal. Also, the electrical coupling between the second coil lead and said first solid state switch may comprise a third coil terminal that is electrically coupled to the second coil lead and electrically coupled by foil on the circuit board to the first solid state switch.

The relay terminals may also include shoulders against which the printed circuit board rests, and they may include stakable portions which, when staked, lock the circuit board in between said shoulder and said stakable portion.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Among other things, the circuitry of the present invention is intended to enable a low-voltage relay 10 to be used safely in higher-voltage environments where the close spacing of the relay contacts 10B and 10C to each other when open might otherwise produce prolonged arcing which could cause a fire if the arc suppression mechanism described below were not present or were to fail. Since the majority of the damage to the contacts 10B and 10C of a relay 10 operating in a high voltage environment occurs during arcing upon the opening of the relay contacts 10B and 10C, as opposed to the closing of the contacts 10B and 10C, the present invention preferably is arranged to provide for arc suppression during the opening of the contacts 10B and 10C, and not necessarily during the closure of the contacts 10B and 10C. Some arcing when the contacts 10B and 10C close can be beneficial in keeping the relay contacts clean and fully operative.

Figure 1:
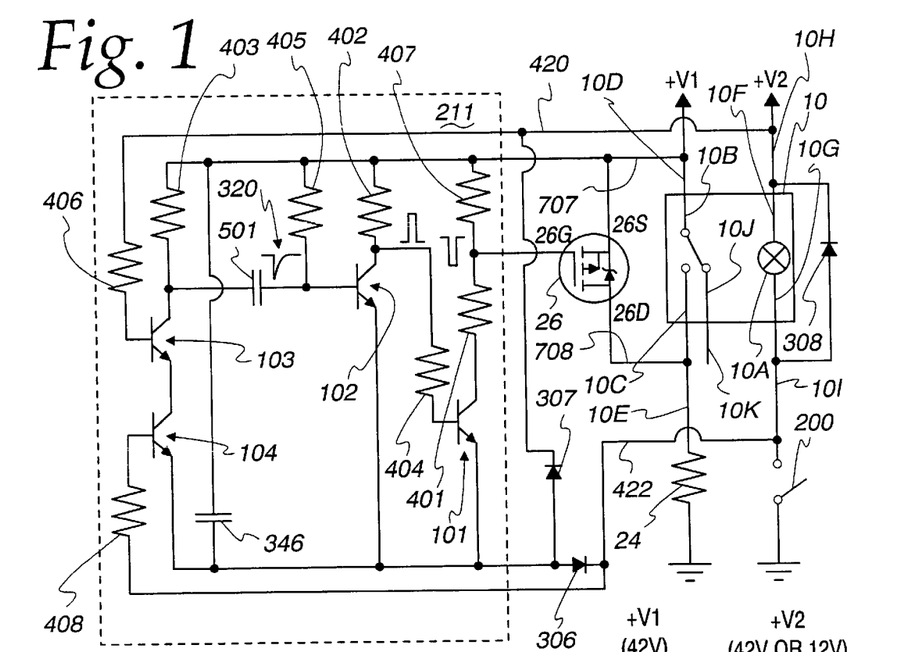
FIG. 1 is a schematic diagram showing one embodiment of an arc suppression device in accordance with the present invention in which the connections to the relay coil may be reversed without adversely affecting the arc suppression mechanism.

FIG. 1 shows one embodiment of a circuit diagram for an arc suppression system designed in accordance with some aspects of the present invention. This embodiment suppresses relay arcing when the contacts 10B and 10C open, and it remains fully operative even if the relay coil 10A external wiring is reversed.

A relay 10 is shown in each of FIGS. 1–4. It contains a relay coil or solenoid 10A having flexible coil leads 10F and 10G respectively connecting to comparatively nonflexible relay terminals or pins 10H and 10I which extend outwards from the housing (not shown) of the relay 10. The coil terminal 10H is coupled by external wiring to a source of supply $_+V_2$. The coil terminal coil 10I is coupled (directly in FIG. 1; and through a switch transistor 513 and a second relay terminal or pin 10L in FIGS. 2–5) to an external switch 200 that connects to ground when it is closed. Normally (always in FIG. 1), closure of the switch 200 applies the voltage $_+V_2$ across the coil 10A and thereby activates the relay 10. Opening of the switch 200 deactivates the relay 10. The purpose of the switch transistor 513 is explained fully in conjunction with the explanations of FIGS. 2–5 which are set forth below.

The switch 200 could be, for example, a switch actuatable by a human or by movement of some mechanism, but it is also intended to serve as a symbolic representation of any source of signal that causes actuation of the relay 10. Hence, it could be a transistor, the contacts of another relay, an optically-actuated solid state switch, or any other suitable signal source or device.

The relay 10 in the preferred embodiment of the invention has a double-throw, single-pole arrangement of its three contacts 10B, 10C, and 10J. A movable contact 10B is normally in contact with a first stationary contact 10J when the relay 10 is not actuated and is at rest. When the coil 10A is energized, the movable contact 10B moves away from the first stationary contact 10J and comes into engagement with a second stationary contact 10C. Deenergization of the coil 10A permits the movable contact 10B, under spring pressure, to move out of engagement with the second stationary contact 10C and thereafter to come to rest in engagement with the first stationary contact 10J. The contact 10J is optional. The relay 10 can optionally have additional poles. In the discussion which follows, the invention is described with respect to the contacts 10B and 10C only to keep the discussion simple and understandable. Its extension to additional poles will in general be straightforward.

The relay contacts 10B, 10C, and 10J are respectively mounted upon or connected to relay contact terminals or pins 10D, 10E, and 10K which extend outwards from the housing (not shown) of the relay 10.

Figure 9:
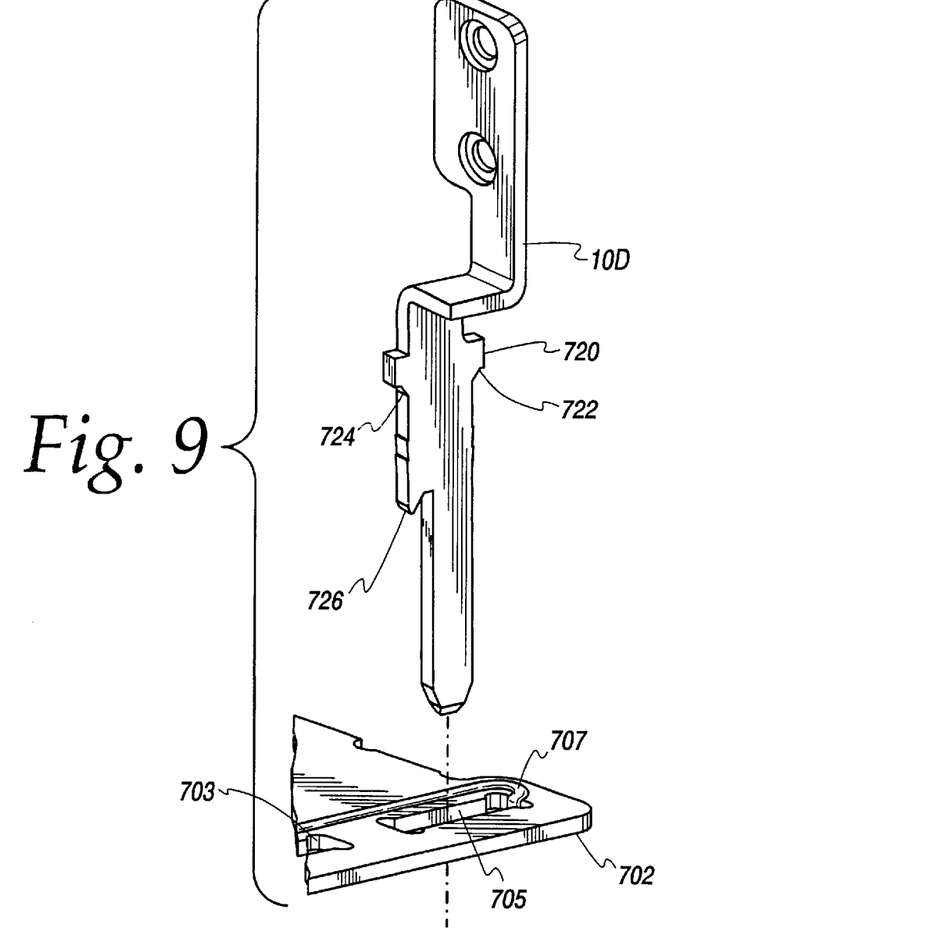
FIG. 9 is an exploded, perspective view of a relay contact terminal 10D and a circuit board, where the contact terminal is inserted downwards through the circuit board to engage a foil 707 on the circuit board.
Figure 10:
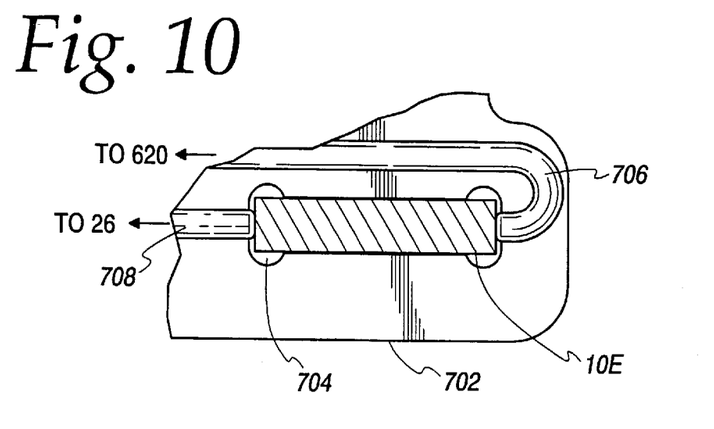
FIG. 10 is a plan view of the same circuit board through which a different relay contact terminal 10E (shown in cross section) is inserted, essentially as illustrated in FIG. 9, but in FIG. 10 the contact terminal engages two separate foils 706 and 708 on the circuit board to allow testing and failsafe operation, as is fully explained in the detailed description that follows.

FIG. 9 illustrates how the relay contact terminal 10D (which connects to the movable contact 10B) passes through a circuit board 702 and engages a foil 707 on the circuit board 702. The foil 707 leads to one of the switch leads of a power MOSFET 26, and in particular to the "source" switch lead 26S. FIG. 10 illustrates how the contact terminal 10E, upon which is mounted the second stationary contact 10C, also passes through the circuit board 702 and independently engages two separate foils 706 and 708 on the circuit board 702. The foil 708 leads to the other of the switch leads of the power MOSFET 26, and in particular, to the "drain" switch lead 26D. The foil 706 (shown in FIGS. 2–4; not presently in FIG. 1) connects to a resistor 620 that connects to the base, or control, lead of the switch transistor 513 (shown in FIGS. 2–4; not present in FIG. 1). These foils and terminals are part of the fail-safe testing circuitry, as will be explained.

The contact terminal 10D also couples the contact 10B to an external source of power $_+V_1$. The contact terminal 10E also couples the contact 10C to an external load 24, which is symbolic of, and which may be, any heater, motor, relay, coil, light, or other system or device that is to receive energizing power when the relay 10 is energized and which is to be denied power only when the relay 10 is deenergized.

The circuit board 702 is punctured by 4 or 5 I-shaped holes (for example: 703 and 705 in FIG. 9; and 704 in FIG. 10). The relay 10 has five terminals (or pins) 10D, 10E, 10H, 10I, and 10K that extend in parallel from the relay housing (not shown) to engage a relay socket (not shown). As illustrated in FIGS. 9 and 10, the circuit board 702 is designed such that the I-shaped holes 703, 704, 705, etc. are aligned with the relay terminals, as is illustrated in FIG. 9 where the terminal 10D is shown aligned with the I-shaped hole 705.

Accordingly, the five terminals 10D, 10E, 10H, 10I, and 10K may be inserted through six I-shaped holes 703, 704, 705, (etc.) in the circuit board 702, and then the circuit board 702 may be slid upwards over the terminals 10D (etc.) until the circuit board 702 engages a shoulder 720 on each of the six terminals. Chamfered portions 722 and 724 of the terminal 10D, as well as comparable chamfored portions of the remaining terminals, then cut into and give a good electrical connection with the foils 707 (FIG. 9), 706 and 708 (FIG. 10), etc. on the circuit board 702.

In the preferred embodiment, a plastic retaining plate (not shown) also having terminal holes (not shown) slides over the terminals 10D (etc.) to contain and to protect the circuit board 702 and to hold the circuit board 702 firmly in place against the shoulders 720. To hold this plastic retaining plate (not shown) in place, cold staking protrusions (such as the tab 726 on the terminal 10D in FIG. 9) are mechanically cold staked, thereby locking the circuit board 702 and plastic retaining plate (not shown) sandwiched in place between the shoulders 720 and the cold staked tabs 726. This arrangement adds circuitry to the relay 10 without increasing its width or depth and with only a slight increase in its height in a direction parallel to the terminals. But more importantly, this arrangement enables multiple foil contacts to connect independently to a single terminal, as is illustrated by the two foils 706 and 708 that make separate and independent contact with the single contact terminal 10E in FIG. 10. This arrangement is desirable to make possible the fail-safe testing of these coil-to-terminal electrical current paths, as will be explained below.

The MOSFET 26 is a p-channel MOSFET mounted upon the circuit board 702 with its switch leads 26S and 26D coupled directly in parallel with the relay contacts 10B and 10C (over the foils 707 and 708 and over the terminals 10D and 10E) and is actuated to short circuit the relay contacts 10B and 10C from just before until a timed interval after the relay contacts 10B begin to open, to suppress contact opening arcing. For example, a MOSFET such as an International Rectifier IRFL9110 or IRFR/U6215 may be utilized.

A timing circuit 211 (FIG. 1) is shown connected to the voltage source $V_1$ and, by means of the foils 420 and 422, to the coil terminals 10H and 10I. One of the terminals 10H or 10I is coupled to $+V_2$ and the other of the terminals 10H or 10I is coupled to the switch 200. The timing circuit 211 is triggered by the opening of the switch 200, which produces a positive-going signal transition on whichever of the terminals 10H or 10I are coupled to the switch 200 (in FIG. 1, the terminal 10I is so coupled). This pulse flows over one of the two foils 420 or 422 and enters the timing circuit 211 through a resistor 406 or another resistor 408. Which path is chosen depends upon the external wiring of the relay coil terminals 10H and 10I, as was just explained. In FIG. 1, this signal transition flows from the terminal 10I over the foil 422 and through the resistor 408. One of the features of the circuitry of FIG. 1 is that the external wiring to the coil terminals 10H and 10I may be reversed without disabling the arc suppression circuitry.

The timing circuit 211 generates a negative timing pulse at the gate control lead 26G of the MOSFET 26 which turns on the MOSFET 26 and renders it conductive for long enough to suppress arcing between the relay contacts 10B and 10C when they open. The timing pulse is adjusted in time duration to cause the MOSFET 26 to keep the contacts 10B and 10C fully shorted until the contacts 10B and 10C are fully open and separated. However, this time duration must be kept short enough to prevent overheating of the MOSFET 26 and to allow a lower power MOSFET 26 to be used, thereby saving cost and reducing the physical bulk of the circuit as well as the need for bulky heat dissipation mechanisms. Also, this time duration must not be so long as to unduly extend the contact closure time interval.

The timing circuits 210, 211, 212, and 213 may be realized in many different ways, as is illustrated in each of the FIGS. 1–4. In the embodiment shown in FIG. 1, this circuit 211 includes at least a first and a second npn transistor 101 and 102. The first npn transistor 101 has two resistors 401 and 407 coupled serially into its collector circuit, and the second npn transistor 102 has a resistor 402 coupled serially into its collector circuit. Each serial circuit formed by the transistors 101 and 102 and their respective collector resistors is connected in parallel across a power supply capacitor 346. The base of the first transistor 101 is coupled to a resistor 404 that is coupled to the collector of the second transistor 102 to form a high gain, two transistor, grounded emitter amplifier. The base of the second transistor 102 is coupled to a timing resistor 405 that is coupled to the first voltage source $V_1$, and this base is also coupled via a timing capacitor 501 to the collector of a third npn transistor 103. The time constant of the resistor 405 and capacitor 501 provide the timing for how long the MOSFET 26 remains conductive to suppress arcing after it is triggered into conduction. The two transistors 102 and 101 simply amplify and invert twice the timing exponential pulse 320 developed by this R–C timing circuit and apply it as a squared off gating signal to the control lead 26G of the MOSFET 26.

The resistor 406 and the resistor 408 are respectively coupled from the signal input foils 420 and 422 to the respective bases of two serially-connected npn transistors 103 and 104. These two transistors operate together in AND-gate fashion such that a positive-going transition provided by the opening of the switch 200 to either side of the relay coil 10A will trigger the timing circuit 211 (depending upon how the coil 10A is wired into the external circuitry).

In FIG. 1, the transistor 103 is kept conductive at all times by current that flows from $+V_2$, thorough the terminal 10H, over the foil 420, through the resistor 406, and into the base of the transistor 103. In addition, when the switch 200 is closed, a ground-level potential passes through the switch 200, the terminal 10I, the foil 422, and the resistor 408 to the base of the transistor 104. This ground-level potential is more negative than the potential at the emitter of the transistor 104, which is coupled to the anode lead of the forward-biased power supply diode 306, the cathode of which diode is grounded by the current path that includes the foil 422, the terminal 10I, and the closed switch 200. Accordingly, the transistor 104 is nonconductive while the switch 200 remains closed.

Whenever the switch 200 is closed, the timing capacitor 501 is kept fully charged by current flow over the path from $+V_1$ that passes through the circuit components 707, 403, 501, 102, 306, 422, 10I, and 200 to ground. The emitter-base junction of the transistor 102, forward-based by the resistor 405, behaves like a forward-biased diode which, together the power supply diode 306, holds the potential of the junction between the timing capacitor 501 and the base of the transistor 102 at about 0.8 volts positive with respect to ground. The potential of the junction between the timing capacitor 501 and the resistor 403 rises rapidly and exponentially to $+V_1$ when the switch 200 first closes. Thus, the potential access to the timing capacitor 501 prior to the opening of the switch 200 is approximately $V_1$ minus 0.8 volts, where the 0.8 volts includes roughly a 0.4 volt drop in potential across each of the power supply diode 306 and the base-emitter junction of the transistor 102.

When the switch 200 opens, current flows from $+V_2$, over the terminal 10H, through the coil 10A and its leads 10F and 10G, through the terminal 10I (which is no longer grounded by the switch 200), over the foil 422, and through the resistor 408 in the base of the transistor 104, thus rendering the transistor 104 conductive. Both the transistors 104 and 103 are now conductive, and each now has an emitter-collector voltage drop of only about 0.1 volt or so. They thus effectively connect the junction of the timing capacitor 501 with the resistor 403 to near-ground potential, about 0.4 volts above ground. This near-ground potential was established by the forward-biased power supply diode 306 and the switch 200 when the switch 200 was closed. Now that the switch 200 is open, the diode 306 is reversed-biased and nonconducting, but the near-ground potential of the emitter of the transistor 104 is still maintained, at least temporarily, by the large, fully charged power supply capacitor 346.

Thus, when the switch 200 opens, the capacitor 501's connection to the transistor 103 collector is pulled to near-ground potential. The capacitor 501 is still fully charged, and accordingly, it behaves momentarily as it were a battery, forcing its other connection to the base of the transistor 102 negative (see the negative transition 320 in FIG. 1). This negative potential cuts off all current flow through the transistor 102, which up until now has been providing near-ground potential through the resistor 404 to the base of the transistor 101, thus keeping the transistor 101 cut off while the switch 200 was open. Accordingly, while the switch 200 was closed, potential from $+V_1$ conveyed thorough the resistor 407 to the control lead 25G of the MOSFET 26 has kept the MOSFET 26 nonconductive.

Now that the switch 200 is open and the timing capacitor 501 has applied the negative timing pulse 320 to the base of the transistor 102, the transistor 102 shuts off. Current now flows from $+V_1$ over the terminal 10D and the foil 707 through the two serially-connected resistors 402 and 404 and into the base of the transistor 101, rendering it conductive.

The resistors 407 and 401 are now connected in series across the power supply capacitor 346, which is still charged close to $+V_1$ potential. The control lead 26G of the MOSFET 26, which connects to the junction of the two resistors 407 and 401, receives a proportion of this potential. Accordingly, the MOSFET 26 is rendered fully conductive, and it effectively shorts together the two relay contacts 10B and 10C.

More specifically, the two switch leads 26S and 26D are respectively connected by the two foils 707 and 708 and by the two terminals 10D and 10E to the two relay contacts 10B and 10C.

Accordingly, the MOSFET 26 short circuits the relay contacts 10B and 10C from a time just before they begin to open until after they are fully open. The exponentially decaying pulse 320, generated by discharge of the time capacitor 501 through the timing resistor 405, decays over time to the point where the base of the transistor 102 is more positive than its emitter. At that point in time, the transistor 102 rapidly switches on, depriving the transistor 101 of its base current, and causing the transistor 101 to turn off very rapidly. The control lead 26G is once again connected to $+V_1$ by the resistor 407, and this causes the MOSFET 26 to switch off so that it no longer short circuits the contacts 10B and 10C. (See the right-hand portions of FIGS., 5, 6A, 6B, 7A, and 8A. Ignore for the moment, the left-hand portions of these figures, which relate only to FIGS. 2–4. These timing diagram figures are explained fully at a later point).

Figure 6A:
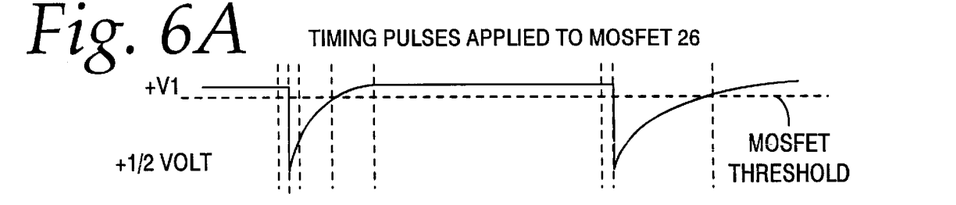
FIG. 6A is a timing diagram showing the generation of timing pulses which are amplified, transformed into square pulses (FIG. 6B), and then applied to the MOSFET 26 in accordance with the embodiments of FIGS. 2, 3, and 4.

(Note that FIG. 6A is drawn as if the timing pulse 320 were applied directly to the control lead 26G of the MOSFET 26, to illustrate how the timing pulse 320 shape controls timing. In actuality, the two intervening transistors 101 and 102 transform the timing pulse 320 into a square waveform, as is indicated in FIG. 1, before it reaches the MOSFET 26).

Figure 8A:
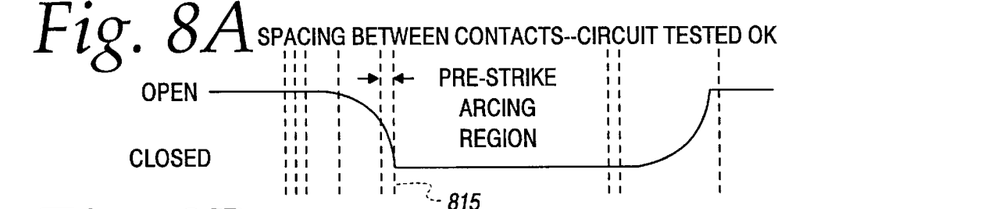
FIG. 8A is a timing diagram showing the spacing between the contacts 10B and 10C wherein the circuit test was successful when implemented in accordance with the embodiments of FIGS. 2, 3, and 4.

Had the MOSFET 26 not intervened, after the switch 200 opened, the lack of any voltage across the coil 10A of the relay 10 would have permitted the normally-open relay contacts 10B and 10C to open, as is illustrated to the left in FIG. 8A. When the contacts first opened, and depending to some degree upon the nature of the load 24 and the value of the potential $+V_1$, an arc between the contacts would have formed, and it would have grown in length and in destructive power as the contacts 10B and 10C gradually separated. This arcing would damage the contacts, and eventually would destroy them, or greatly shorten their lives. Greater inductance within the load 24, as when the load 24 is a motor winding, a relay coil, or a magnet within a tool or machine, would prolong and strengthen this arcing. And since the spacing between the contacts 10B and 10C is relatively small compared to the potential $+V_1$, this arcing might not terminate as the contacts open wider and wider, and might continue after the contacts 10B and 10C are fully separated, thus giving rise to severe contact damage and the possibility of severe heating, failure, and the possibility of a fire.

All such arcing is prevented by the MOSFET 26 when it short circuits the contacts 10B and 10C while they open. When the MOSFET 26 finally ceases to conduct, the contacts 10B and 10C are fully separated, and they cannot arc over. If the load 24 is inductive, the collapse of current flow through the inductive load 24 will generate an electromotive force that will attempt to arc over the contacts 10B and 10C to keep the current through the load 24 flowing until the magnetically-stored energy in the load 24 is dissipated. But before the contacts 10B and 10C can arc over and before the maximum potential which can be applied across the switch leads 26S and 26D of the MOSFET 26 can be exceeded, a Zener diode within the MOSFET 26 becomes conductive. This Zener diode limits the rise in potential that can occur between the contacts 10B and 10C and also between the switch leads 26S and 26D to a safe value. This Zener diode also safely dissipates, within its internal resistance, any inductive energy that is pumped into the load 24 current flow by the collapse of any magnetic fields within the load 24. Hence, no arcing occurs.

If the wiring of the relay coil terminals 10H and 10I into the circuitry external to the relay 10 (such as to $+V_2$ and to the switch 200) is reversed, the circuit shown in FIG. 1 behaves in precisely the same manner, except as follows:

In this configuration (not as shown in FIG. 1), with $+V_2$ connecting to the terminal 10I instead of to the terminal 10H, and with the switch 200 connecting to the terminal 10H instead of the terminal 10I, and with the relay coil 10A arc suppression diode 308 also reversed:

The transistor 104 is now kept conductive at all times by current which flows from $+V_2$ over the terminal 10I and through the foil 422 and the resistor 408 to the base of the transistor 102;

The transistor 103 is rendered nonconductive while the switch 200 is closed by a ground-level potential which is conveyed through the switch 200, over the terminal 10H and through the foil 707 and the resistor 406 to the base of the transistor 103;

When the switch 200 opens, current flows from $+V_2$, over the terminal 10I, through the coil 10A and its lead 10F and 10G, through the foil 420, and through the resistor 406 into the base of the transistor 103, rendering the transistor 103 nonconductive;

And accordingly, the opening of the switch 200 causes both of the transistors 103 and 104 to be conductive and activates the timing circuit 211, just as has been explained above.

Accordingly, reversal of the coupling of the coil terminals 10H and 10I to the outside world is possible and does not stop the arc suppression circuitry from functioning properly. If the diode 308 cannot be reversed, it can be replaced with a Zener diode.

The timing circuit 201 receives power from a power supply capacitor 346. The emitters of the first, second and fourth transistors 101, 102, 104 and the collector resistors 402, 403, and 407 are connected in parallel to the capacitor 346 as a source of supply. One terminal of the capacitor 346 connects to the stable supply voltage $V_1$, and the other terminal of this capacitor 346 is connected by a pair of rectifying diodes 306 and 307 to either side of the relay coil 10A so as to derive power from ground through the switch 200 whenever the switch 200 is actuated to power the relay coil 10A and so as to be operative regardless of which side of the relay coil 10A is grounded by the switch 200. Hence, ground-level voltage can be captured from either side of the relay coil 10A to charge the capacitor 346 from the first voltage source $V_1$ whenever the relay 10 is actuated by the switch 200. Accordingly, the terminals 10H and 10I of the relay coil 10A may be wired into the external circuit of $_+V_2$ and the switch 200 in reverse, and the circuit will still be powered.

A diode 308, connected between the coil terminals 10H and 10I, suppresses arcing generated inductively by the coil 10A when the switch 200 opens. This diode may be a Zener diode, as noted above.

The source switch lead 26S of the p channel MOSFET 26 is shown coupled to the first voltage source $V_1$ by the foil 707 which connects to the relay contact terminal 10D that connects to the voltage source $_+V_1$. The relay coil 10A is shown connected to a separate voltage source $+V_2$ by the coil lead 10F and the coil terminal 10H. These two supply voltages $+V_1$ and $+V_2$ may be selected to be either the same potential or different potentials. In addition, and as has been explained, the relay coil terminal connections may be reversed without disabling the circuit because the two alternative rectifier diodes 306 and 307 and the two signal resistors 408 and 406 are provided, as has been explained, to compensate for such a reversal.

Figure 2:
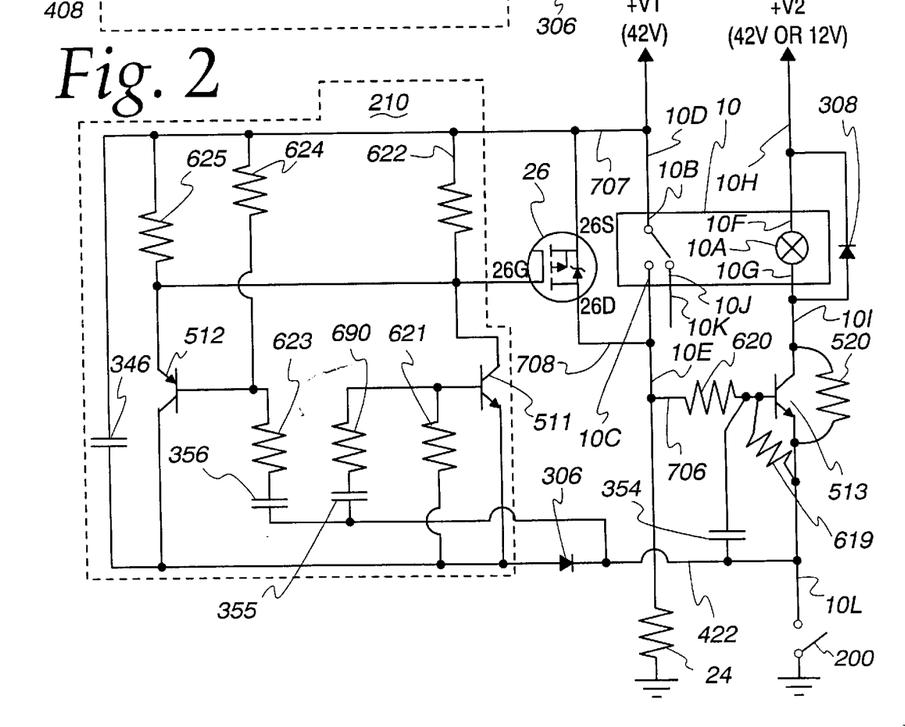
FIG. 2 is a schematic diagram showing a second embodiment of an arc suppression device in accordance with the present invention that includes a mechanism for testing the MOSFET and its connections to the relay terminals and for disabling the relay if the test reveals any problem.
Figure 3:
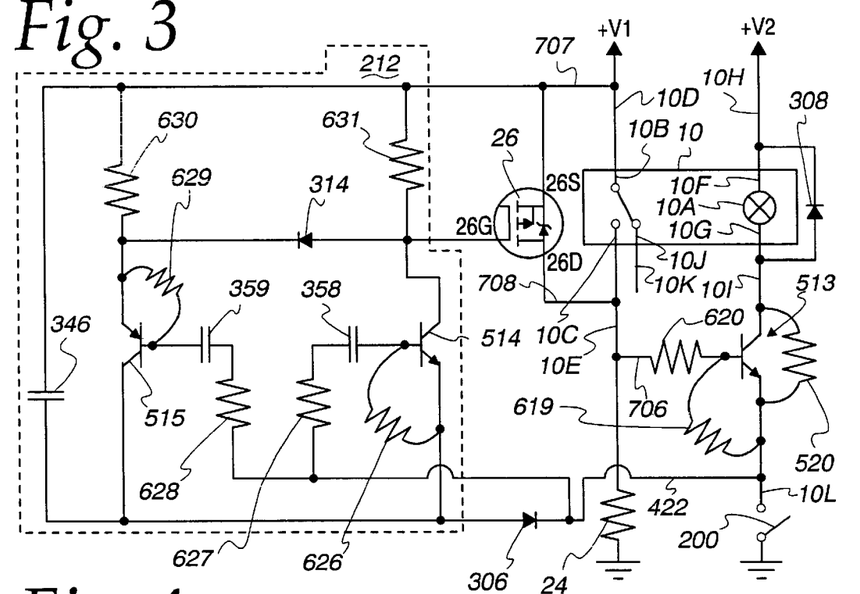
FIG. 3 is a schematic diagram showing a third embodiment of an arc suppression device in accordance with the present invention similar to that shown in FIG. 2.
Figure 4:
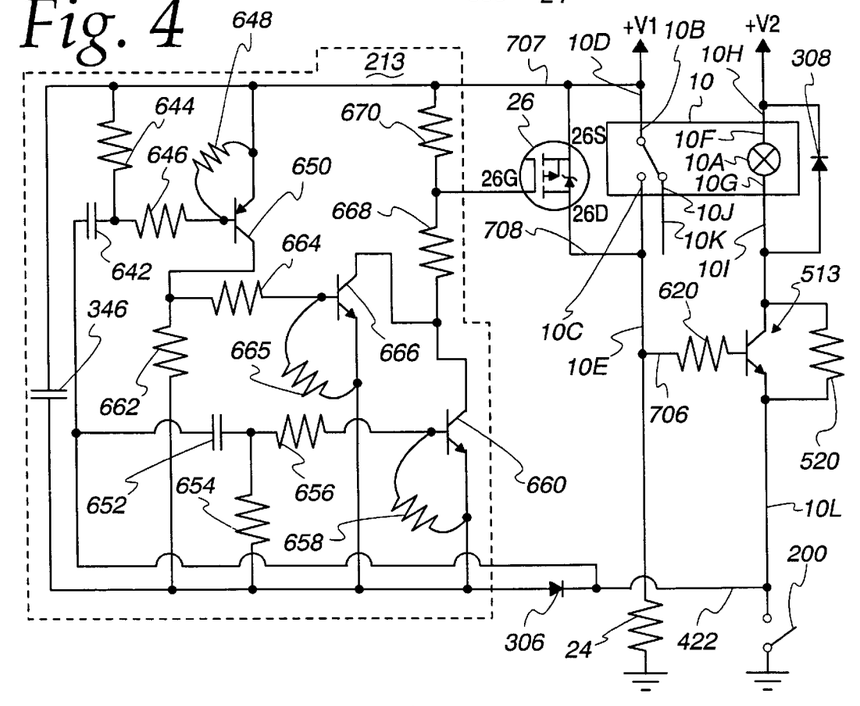
FIG. 4 is a schematic diagram showing a fourth embodiment of an arc suppression device in accordance with the present invention also similar to those shown in FIGS. 2 and 3.

FIGS. 2, 3, and 4 show second, third, and fourth embodiments of circuits for arc suppression which, in addition to arc suppression, include circuit testing and relay disabling circuits to test the arc suppression circuitry and to prevent the relay from being actuated if there is any risk that arcing cannot be suppressed.

The circuits of FIGS. 2–4 also include timing circuits 210 (FIG. 2), 212 (FIG. 3) and 213 (FIG. 4). These timing circuits, like the timing circuit 211 shown in FIG. 1, generate a timing pulse (similar to the pulse 320 shown in FIG. 1) that causes the MOSFET 26 to conduct and to suppress arcing when the contacts 10B and 10C open in response to the switch 200 opening. Since the arc suppression portions of FIGS. 2–4 are essentially the same as those of FIG. 1, these portions need not be described again in full—only the ways in which they differ from FIG. 1 will be noted at appropriate points below.

In addition, these (FIGS. 2–4) timing circuits also respond when the switch 200 initially closes not to suppress arcing, but to generate a brief "test" pulse (similar to the pulse 320 shown in FIG. 1) which causes momentary conduction of the MOSFET 26 for circuit test purposes. Preferably, this "test" pulse is brief enough so that it does not suppress all contact closure arcing and thus permits the contacts 10B and 10C to self-clean in a non-destructive manner. This "test" pulse tests the MOSFET 26 and its connections to the relay contact terminals 10D and 10E to insure that later on, when the relay contacts 10B and 10C open, arcing will be suppressed.

The relay 10, in FIGS. 2–4 (not in FIG. 1), has a sixth terminal 10L that does not connect directly to either the coil 10A and its leads 10F and 10G nor to any of the three relay contacts 10B, 10C, and 10J. The coil 10A and its leads 10E and 10F still connect to the terminals 10H and 10I, as shown in all the FIGS. 1–4, but in FIGS. 2–4 the terminal 10I may optionally be cut short so that it does not extend beyond the housing (not shown) of the relay 10.

A new component, a switch transistor 513, having a base resistor 620 and a resistor 520 interconnecting its emitter and collector, appears in FIGS. 2–4 and not in FIG. 1. This transistor 513 has its collector coupled by foil on the circuit board 702 to the relay coil terminal 10I, and it has its emitter coupled by foil on the circuit board 702 to a sixth relay terminal 10L that serves as an internal connection (and that is short so that is does not extend from the relay housing). The switch transistor 513, when conducting, electrically connects together the two terminals 10I and 10L and causes the circuitry in FIGS. 2–4 to then match the circuitry in FIG. 1.

The switch 200 connects the new internal connection terminal 10L to ground in FIGS. 2–4. The switch 200 no longer connects the relay coil terminal 10I to ground, as it does in FIG. 1.

The relay 10 shown in FIGS. 2–4, when in its quiescent state with the switch 200 open, is designed to deenergize the switch transistor 513 so that it disconnects the relay coil 10A from the switch 200. Accordingly, closure of the relay 200 does not immediately actuate the coil 10A in FIGS. 2–4. Instead, it sends a ground-level potential through the terminal 10L, across the foil 422 on the circuit board 702, and through the power supply diode 306 that charges fully the power supply capacitor 346 for the timing circuit 210, 212, or 213. Closure of the switch 200 also sends a ground potential signal through the terminal 10L and across the foil 422 to inside of the timing circuits 210, 212, or 213 where this signal triggers the generation of the "test" pulse that tests the circuitry and that energizes the switch transistor 513 to allow energization of the coil 200 only after the operating state of the MOSFET and its connections to the terminals and contacts of the relay 10 has been positively confirmed by the test.

At the start of this test, when the switch 200 is first actuated, the switch transistor 513 receives no base current, and accordingly it is nonconductive. Its base is coupled to ground through the load 24 by the resistor 620 and by the terminal 10E, and this coupling switches off the transistor 513 when the contacts 10D and 10E are open, as is the case when the relay coil 10A is not energized. The switch transistor 513 accordingly prevents any current supplied by the switch 200 from reaching the relay coil 10A, and thus it prevents the relay 10 from operating until after the brief test verifies that the arc suppression circuit is fully operational.

The resistor 520, the terminal 10I, the coil 10A, and its leads 10F and 10G, and the terminal 10H form a high impedance connection between the foil 422 and $+V_2$ that biases the foil 422 positive whenever the switch 200 is open. This discharges the two timing capacitors 355 and 356 in FIG. 2, 358 and 359 in FIG. 3, and 642 and 652 in FIG. 3. The power supply capacitor 346 also discharges at such times. (If $V_1$ and $V_2$ are not equal, some of these capacitors may be partially charged.)

The test pulse is generated by the timing circuits (210, 212, or 213) in response to closure of the switch 200. This closure grounds the foil 422 and generates a negative switching signal that flows over the foil 422 and into the timing circuits 210, 212, or 213. In response, the timing circuits 210, 212, or 213 cause the MOSFET 26 to conduct, if it is still operative; and this conduction (of the MOSFET 26) is one of the things which the test is actually verifying. Accordingly, a test current flows from the source $+V_1$, down through the contact terminal 10D and over the foil 707 on the circuit board 702 (FIG. 9) to the source switch lead 26S of the MOSFET 26. Since the MOSFET 26 is conductive, this test current flows through the MOSFET 26, out of its drain switch lead 26D, and over the foil 708 on the circuit board 702 (FIG. 10). This test current, if it can, flows out of the foil 708 and through the relay contact terminal 10E (FIG. 10) to and through the load 24 to ground. As is shown in FIG. 10, the contact terminal 10E extends through an I-shaped hole 704 in the circuit board 702, and it makes contact with both the foil 708 and another foil 706, connecting them together electrically to provide a test current flow path if all is well with these two mechanical (non-soldered) electrical connections. The test, accordingly, determines whether the couplings between the MOSFET 26 switch leads 26S and 26D and the respective relay contact terminals 10D and 10E are solid, and also whether the MOSFET 26 is operational. If all is well, then some of the test current also flows out of the contact terminal 10E, over the foil 706, through the resistor 620, and into the base of the switch transistor 513. The switch transistor 513 then is switched into a conductive state by this test current, and it energizes the relay coil 10A by current flow from $_+V_2$ to ground over the path 10H, 10F, 10A, 10G, 10I, the switch transistor 513, 10L, and the switch 200.

To summarize, if and only if the MOSFET 26 is functioning properly and has both of its switch leads 26S and 26D properly and solidly electrically connected to both the contact terminals 10D and 10E of the relay 10, then a small part of the test current (the part that does not flow through the load 24) flows from $V_1$ over the path 10D, 707, 26S, 26, 26D, 708, 10E, 706, and 620 to the base of the transistor 513, where the test current switches on the transistor 513 and thereby permits the switch 200 to energize the relay coil 10A, and thus to actuate the relay 10 to close its contacts 10B and 10C and to supply the full voltage $_+V_1$ to the load 24.

A capacitor 354 (FIG. 2), or simply the width of the negative pulse generated by the timing circuit 212 (FIGS. 3 and 4), keeps the transistor 513 conducting until the relay contacts 10B and 10C fully close, after which time current flowing from $+V_1$ over the path 10D, 10B, 10C, 10E, 706, and 620 flows to the base of the transistor 513 and keeps the transistor 513 conductive for as long as the switch 200 keeps the relay 10 energized.

Finally, when the switch 200 opens, contact-opening arcing is suppressed in the manner explained fully above in conjunction with FIG. 1. The power supply and timing capacitors then discharge, returning the timing circuit to its quiescent state.

In all of the FIGS. 2, 3, and 4, the relay coil 10A has its lead 10F coupled by the coil terminal 10H to $_+V_2$, which is 12 volts or 42 volts. The relay contact 10C is coupled by the contact terminal 10D to $_+V_1$, which is 42 volts. Where desired, suitable voltages other than +12 volts or +42 volts may be utilized.

The circuit details of the timing circuits 210, 212, and 213 shown in FIGS. 2, 3, and 4 will now be described.

The timing circuits 210 and 212 in FIGS. 2 and 3 include: an npn transistor 511 or 514 having a collector resistor 622 or 631; and a pnp transistor 512 or 515 having a emitter resistor 625 or 630; each of these transistor-resistor serial pairs is connected in parallel across the power supply capacitor 346, as shown. The gate control lead 26G of the MOSFET 26 is coupled to the collector of the second npn transistor 511 or 514 and to the emitter of the pnp transistor 512 or 515 either directly (in FIG. 2) or through diode 314 (in FIG. 3).

In FIGS. 2 and 3, the base of the npn transistor 511 or 514 is connected to a resistor 621 or 626 that is connected to the emitter of the transistors 511 or 514. A timing resistor 690 or 627 that is connected in series with a timing capacitor 355 or 358 is coupled to the switch 200 by the foil 422 and the sixth terminal 10L to which the switch 200 is coupled. This signal path (elements 200, 10L, 422, 355, and 690 in FIG. 2; and elements 200, 10L, 422, 627, and 358 in FIG. 3) responds and turns on the MOSFET 26 in response to positive input voltage transitions whenever the switch 200 opens, generating an arc suppression timing pulse for the MOSFET 26.

In FIGS. 2 and 3, the base of the pnp transistor 512 or 515 is coupled by a resistor 624 or 629 to $+V_1$ (FIG. 2) or to its emitter (FIG. 3). This base is also connected to a timing resistor 623 or 628 connected in series with another timing capacitor 356 or 359 that is connected to the switch 200 by the foil 422 and the sixth terminal 10L. This signal path (elements 200, 10L, 422, 356, and 623 in FIG. 2; and elements 200, 10L, 422, 628, and 359 in FIG. 3) receives and responds to negative input voltage transitions whenever the switch 200 closes, generating the test timing pulse for the MOSFET 26.

In FIGS. 2 and 3, in response to the initial closure of the switch 200, the timing capacitor 356 or 359 and timing resistor 623 or 628 supply a negative timing pulse through the emitter-follower PNP transistor amplifier 512 or 515 directly to the gate control lead 26G of the MOSFET 26 (through the diode 314 in FIG. 3 only) to initiate a fail-safe test of the circuit, as has been explained. In response to the later opening of the switch 200, the timing capacitor 355 or 358 and timing resistor 690 or 627 supply a positive timing pulse that is inverted and amplified by the NPN transistor 511 or 514 and applied to the gate control lead 26G of the MOSFET 26 to suppress contact opening arcing, as has been explained.

In FIG. 4, when the switch 200 closes, current flows through the terminal 10L and over the foil 422 to the RC timing circuit formed by the timing capacitor 642 and the essentially parallel timing resistors 644 and 646 and causes the PNP transistor 650 to apply a positive timing pulse through the inverting NPN transistor 666 to the gate control lead 26G of the MOSFET 26 as a negative timing pulse that initiates a test of the circuitry, as has been explained.

Later, when the switch 200 opens, current flows again through the terminal 10L and over the foil 422 to the RC timing circuit formed this time by the timing capacitor 652 and the essentially parallel resistors 654 and 656 and causes the NPN transistor 660 to apply a negative timing pulse to the gate control lead 26G or the MOSFET 26 to imitate arc suppression, as has been explained.

Typically, and with reference to FIGS. 9 and 10, a mechanical, rather than a solder, connection is established between the terminals 10D, 10E, etc., of the relay 10 and the circuit board 702 and its foil 706, 707, 708, etc. For example, the relay terminals may be connected to the printed circuit board 702 using a press-fit technique, a through-hole followed by staking, a through-hole with press-fit only, or a through hole with bending of all or a portion 726 of the terminal 10D (FIG. 9) after insertion into the holes 703, 704, 705, etc. in the circuit board 722 to achieve a secure electrical and mechanical connection.

In FIG. 9, the relay contact terminal 10D is coupled to the movable contact 10B (not shown in FIG. 9) of the relay 10 and is also externally coupled to $_+V_2$. This relay contact terminal 10D is electrically coupled by one foil 707 on the circuit board 702 to the MOSFET 26's source switch lead 26S. In FIG. 10, the relay contact terminal 10E is coupled to (and actually supports, although this is not shown) the second stationary contact 10C of the relay 10 (the contact 10C is not shown in FIG. 10) and is also coupled externally to the load 24. The contact terminal 10E is electrically coupled by one foil 708 to the MOSFET 26's other drain switch lead 26D and is coupled by another foil 706 through the resistor 620 to the base of the switch transistor 513 that disables the relay if the test fails. The foils 706 and 708 are only coupled together electrically by the terminal 10E, as can be seen in FIG. 10.

Thus, the present invention provides improved functionality and reduced complexity for an electronic relay with provision for arc suppression and automatic fail-safe testing.

Preferably, the added arc suppression circuitry draws power only from the relay terminals 10D and 10L in FIGS. 2–4 or from relay terminals 10D and 10I in FIG. 1 and requires no other independent electrical connections so as not to interfere any more than necessary with normal relay operation and mounting. Power could, optionally, be drawn from other terminals of the relay 10.

Figure 6B:
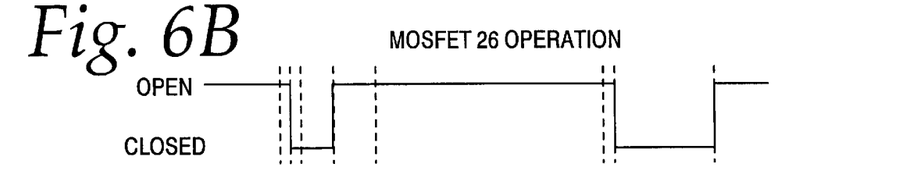
FIG. 6B is a timing diagram showing the operation of MOSFET 26 in accordance with the embodiments of FIGS. 2, 3, and 4.
Figure 7A:
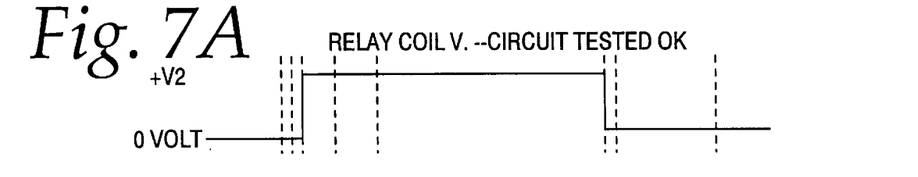
FIG. 7A is a timing diagram showing the relay coil voltage wherein the circuit test was successful when implemented in accordance with the embodiments of FIGS. 2, 3, and 4.
Figure 7B:
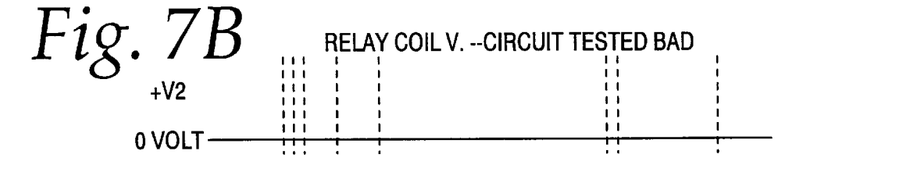
FIG. 7B is a timing diagram showing the relay coil voltage wherein the circuit failed when tested in accordance with the embodiments of FIGS. 2, 3, and 4.
Figure 8B:
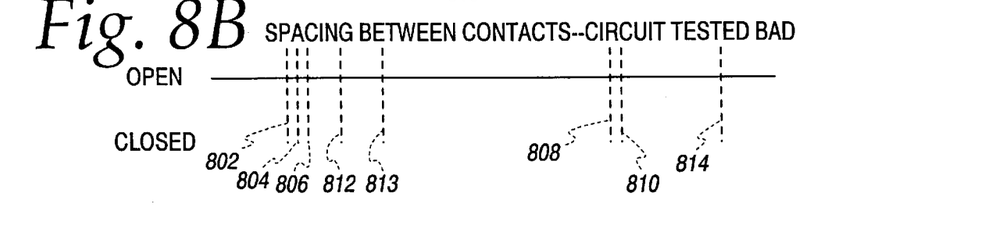
FIG. 8B is a timing diagram showing the spacing between contacts 10B and 10C wherein the circuit failed when tested in accordance with the embodiments of FIGS. 2, 3, and 4.

FIGS. 5, 6A, 6B, 7A, 7B, 8A, and 8B are timing diagrams, drawn to the same time scale, illustrating the operation of the present invention as implemented in FIGS. 2–4, with testing done prior to any actuation of the relay 10, and with disablement of the relay 10 if the testing reveals any problem, and with normal arc-suppressed relay operation if all is well. The right half of FIGS. 5, 6A, 6B, 7A, and 8A also illustrate the operation of the invention as implemented in FIG. 1. FIGS. 8A–8B illustrate the spacing between the normally-open relay contacts 10A and 10C during testing and during relay operation.

Figure 5:
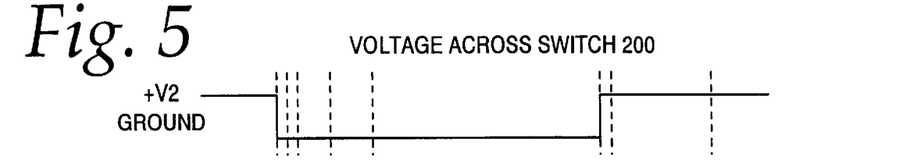
FIG. 5 is a timing diagram showing the voltage across the switch 200 in accordance with the embodiments of FIGS. 2 and 3.

FIG. 5 illustrates the voltage across the switch 200 which provides the signal that actuates the relay 10 at a time 802 and deactuates the relay 10 at a time 808. For example, the switch 200 could be a switch that a passenger in an automobile depresses to lower the adjacent window, and the relay 10 could then close its contacts 10B and 10C to supply power to a load 24 which is the motor that actually drives the window up or down. At a time indicated by the vertical, hashed timing line 802, the switch 200 is actuated, thereby causing the coupled relay terminal 10L to drop in potential from the voltage level $_+V_2$ to ground potential. But because the transistor switch 513 is non-conductive at this time, no current from the switch 200 reaches the relay coil 10A, which remains with a zero voltage differential across its terminals, as can be seen in both the FIGS. 7A and 7B at the times 802 and 804 and shortly thereafter.

The sudden drop in the potential of the switch 200's upper contact is conveyed into the timing circuit 210, 212 or 213 where it causes a negative timing pulse (FIG. 6A) to be developed and applied to the gate control lead 26G of the MOSFET 26 at the time 804. The timing pulse is developed at the base of the transistor 512 (FIG. 2), 515 (FIG. 3), or 650 (FIG. 4) and is shown in the timing diagram of FIG. 6A as it might appear at the control lead 269 of the MOSFET 26 (note that amplification may convert this exponential wave shape into a square pulse applied to the control lead 26G instead of the exponential waveform shown in FIG. 6A).

FIG. 6B illustrates the closure of the MOSFET 26 in accordance with the embodiments of FIGS. 2 to 4. As can be seen, the switch 200 closes at the moment in time 802; and then just a moment later, at the moment in time 804, the negative timing pulse shown in FIG. 6A is applied to the MOSFET 26, causing the MOSFET 26 to conduct and to "close" for a time interval just long enough (time 804 to time 812) to permit the circuitry to conduct the necessary test but, preferably, short enough so that some contact closure arcing can still occur to clean the contacts 10B and 10C. At the time 812, the negative timing pulse of FIG. 6A applied to the MOSFET 26 returns close enough to $_+V_1$ to permit the MOSFET 26 to become an open circuit, as is indicated in FIG. 6B, preferably soon enough so as not to suppress all contact closure arcing, as is shown in FIG. 8A where "pre-strike arcing" is permitted to occur.

If the MOSFET 26 is in good repair, and if its connections with the relay terminals 10D and 10E are also in good repair, then current will flow from $_+V_1$, through the relay's contact terminal 10D and foil 707, through the switch leads 26S and 26D of the MOSFET 26, over the foil 708, through the relay 10's contact terminal 10E and the foil 706, and through the resistor 620 to the base of the switch transistor 513. This current turns on the transistor 513 and renders it a short circuit that directly connects the relay coil 10A between $_+V_2$ and the upper (nongrounded) contact of the switch 200, thereby applying the voltage $+V_2$ directly to and fully across the relay coil 10A for the first time, at time 806. Accordingly, at time 806, FIG. 7A shows that the relay coil 10A is fully energized with the voltage $_+V_2$. The relay coil 10A then forces the relay contact 10D into motion, as is illustrated in FIG. 8A, and ultimately the contacts 10B and 10C close, preferably after the negative timing pulse (the first pulse in FIG. 6A that initiated the test procedure) terminates (crosses the MOSFET threshold in FIG. 6A) so that there is some contact closure arcing.

(Note that the separation between the time lines 802, 804, and 806 and between the time lines 808 and 810 in FIGS. 5 through 8 is exaggerated for clarity.)

As the contacts 10B and 10C come into close proximity with one another, it is possible for an arcing episode to occur, for example, in a pre-strike arcing interval 813 to 815, as is shown in FIG. 8A. Many factors influence this striking action, such as voltage, contact material, distance between contacts, and the like. In an electromechanical relay, the only factor that varies is the distance. When the relay coil is energized, the contacts draw closer together. When the contacts reach an extremely close proximity, based upon voltage and material, an arc column will form. The arc column lasts until the contacts seat against each other. Clearly, bouncing contacts may cause subsequent similar arcing action. Such arcing at the closing of the contacts typically takes place in a very short time frame, e.g., in the microseconds range before the contacts initially seat, and is not normally suppressed by the present invention.

At a later point in time, indicated by the time line 808, the switch 200 opens again, as when the one opening or closing a car window removes his or her finger from the switch. As can be seen in FIG. 5, this produces a sudden rise in potential at the switch 200 where it couples to the terminal 10L, and FIG. 7A shows that the relay coil 10A is instantly deenergized. This sudden rise in potential at the terminal 10L is transformed into a negative pulse that is applied to the gate control lead 26G of the MOSFET 26. This pulse renders the MOSFET 26 conductive again such that it short circuits the relay contacts 10B and 10C, as is shown to the right in FIG. 6B. As can be seen in FIGS. 6B and 8A, the timing pulse applied to the MOSFET 26 (to the right in FIG. 6) commences at a time 810, a very brief time after the switch 200 opens at time 808, and well before the relay contacts 10C begin to open (FIG. 8A). Accordingly, the MOSFET 26 suppresses all arcing of the relay contacts 10B and 10C as they open. Note that the timing pulse duration (to the right in FIGS. 6A and 6B) is chosen to endure until the relay contacts 10C are fully open (as is shown to the right in FIG. 8A).

However, if the test should fail, then no current or too little current reaches the base of the switch transistor 513, which then remains nonconductive, preventing any significant voltage or current from being applied to the relay coil 10A. In that case, FIG. 7B indicates that the relay coil is never supplied with any voltage, and accordingly FIG. 8B indicates that the relay contacts 10B and 10D are never caused to close. While the relay 10 does not function normally, there is no arcing and thus no fire hazard or contact damage.

Thus, a simplified fail-safe arc suppression circuit for efficient contact protection has been described, according to the present invention. Many modifications and variations may be made to the techniques and structures described and illustrated herein without departing from the spirit and scope of the invention. Accordingly, it should be understood that the circuits described herein are illustrative only and are not limiting upon the scope of the invention.

What is claimed is:

1. A method for safely suppressing the arcing of a relay's contacts when the contacts open using a solid state switch connected in parallel with the relay's contacts as an arc suppressing device, this method comprising the steps of:

sensing the relay coil energization signal before its contacts close;

in response, energizing the solid state switch to short the relay contacts together;

testing whether the potential across the relay's contacts drops to a very low potential in response to this energization of the solid state switch before the relay's contacts close;

if the potential across the relay's contacts is not very low:
        preventing energization of the relay coil and subsequent contact closure at least until contact closure energization terminates;

and if the potential across the relay's contacts is very low:
        permitting energization of the relay coil and subsequent contact closure;
        sensing deenergization of the relay before its contacts open;
        and in response, energizing the solid state switch again to short the relay contacts together long enough to suppress arcing that would otherwise occur when the relay's contacts open.

2. A method in accordance with claim 1 wherein the energizing of the solid state switch in response to sensing energization of the relay before its contacts close is a brief enough energization such that some contact closure arcing is permitted to occur to keep the contacts in good condition.

3. A method in accordance with claim 2 which includes the steps of permitting energization of the relay whenever its contacts are closed;

and preventing energization of the relay whenever its contacts are open, but permitting energization of the relay for a brief time, long enough to permit the contact closure, after such a test determines the potential across the solid state switch connected in parallel with the relay's contacts is very low.

4. A method in accordance with claim 3 in which the steps of sensing energization or deenergization of the relay are carried out by sensing a potential change at whichever end of the relay's coil is free to change its potential in response to an incoming energization signal such that the method works regardless of which end of the coil of the relay may be connected to a fixed potential.

5. A method in accordance with claim 1 which includes the steps of permitting energization of the relay whenever its contacts are closed;

and preventing energization of the relay whenever its contacts are open, but permitting energization of the relay for a brief time, long enough to permit the contact closure, after such a test determines the potential across the relay's contacts is very low.

6. A method in accordance with claim 5 in which the steps of sensing energization or deenergization of the relay are carried out by sensing a potential change at whichever end of the relay's coil is free to change its potential in response to an incoming energization signal such that the method works regardless of which end of the coil of the relay may be connected to a fixed potential.

7. A method in accordance with claim 1 in which the steps of sensing energization or deenergization of the relay are carried out by sensing a potential change at whichever end of the relay's coil is free to change its potential in response to an incoming energization signal such that the method works regardless of which end of the coil of the relay may be connected to a fixed potential.

8. An arc suppression system for a relay having at least one pair of normally open contacts, having an energizing coil with at least two leads, and having at least two contact terminals and two coil terminals respectively electrically coupled to each of the contacts and to each of the coil leads, said system comprising:

a solid state contact shorting switch having two switch leads connected in parallel with the two contact terminals and having a control lead which, when energized with an input signal, causes said switch to effectively short circuit the two contacts of the relay;

a first timing pulse generator receiving an input signal from at least one of the two coil terminals and responding to a coil energizing signal by generating a first timing pulse which, when applied to the solid state switch's control lead, causes momentary conduction of the switch;

a circuit tester and coil switch having an input coupled to at least one of the two contact terminals independently of the switch leads of said solid state switch and arranged to signal, by its conductive or nonconductive state, whether the two relay contacts are or are not effectively short circuited by the solid state switch, this coil switch having two switch leads which form an electrically conductive part of one of the two electrical couplings between the coil leads and the coil terminals, such that the coil cannot be energized to close the relay contacts unless the coil switch first verifies the proper operation of the contact shorting switch and its connections to the contact terminals; and a second timing pulse generator receiving an input signal from at least one of the two coil terminals and responding to the termination of a coil energizing signal by generating a second timing pulse which, when applied to the solid state switch's control lead, causes conduction of the contact shorting switch of sufficient duration to suppress contact opening arcing.

9. A system in accordance with claim 8 wherein the first timing pulse generator generates a timing pulse of such short duration that some contact closure arcing is permitted to occur; and wherein the circuit tester and coil switch includes a time delay that maintains the coil switch conductive after it is first rendered conductive for sufficient time so that it remains conductive during any brief moment when the contacts are not fully closed following the opening of the contact shorting switch after the circuit testing is completed.

10. A system in accordance with claim 9 wherein the two timing pulse generators include inputs connecting to both coil terminals to sense commencement and termination of energization signals regardless of which end of the coil may not be free to fluctuate in potential.

11. A system in accordance with claim 8 wherein the two timing pulse generators include inputs connecting to both coil terminals to sense commencement and termination of energization signals regardless of which end of the coil is free to fluctuate in potential.

12. A fail-safe arc suppression system for a relay whose contacts are subjected to voltages that are high relative to the relay's maximum open contact separation distance, thereby creating a risk of possible sustained arcing if contact opening arcing is not carefully and fully suppressed, said system comprising:

a relay having an energizing coil having first and second coil leads respectively electrically coupled to first and second relay coil terminals of the relay and having at least first and second normally open relay contacts respectively electrically coupled to first and second relay contact terminals of the relay, the relay contacts arranged to close upon energization of the energizing coil and arranged to open in response to deenergization of the energizing coil;

a first solid state switch having a first switch control lead and having first and second switch leads, the first and second switch leads being coupled electrically respectively to the first and second relay contact terminals such that energization of the control lead causes the switch to effectively short circuit the relay contacts;

a second solid state switch having a second switch control lead and having first and second switch leads that form part of the electrical coupling between at least one coil lead and its respective coil terminal such that a signal applied to the second switch control lead can permit or block the energization of the relay coil, said second switch control lead being electrically coupled to the one of said contact terminals that is intended to be connected to a load such that when the contact terminals are effectively short circuited, a signal is applied to the second switch control lead that permits the relay coil to be energized;

a circuit having at least one input electrically coupled to at least one of said first and second coil terminals and having an output electrically coupled to said first solid state switch's control lead;

said circuit responding to a signal change at the circuit's input in a direction signaling the removal of energy from said energizing coil by applying a first timing signal pulse having a first pulse duration to the first solid state switch control lead, the first pulse's duration being sufficiently long to cause the first solid state switch to effectively short circuit the relay contacts while they open to suppress contact closure arcing; and said circuit responding to a signal change at the circuit's input in a direction signaling the application of energy to said energizing coil by applying a pulse to the first solid state switch of sufficient duration to permit the second solid state switch to test for proper operation of said first solid state switch and its electrical coupling to the relay contact terminals before permitting the relay coil to be energized.

13. A system in accordance with claim 12 wherein the circuit includes two timing signal pulse generators:

one that responds to a signal fluctuation that indicates cessation of the coil energization signal by generating a pulse of sufficient time duration to permit full arc suppression during contact opening;

and the other that responds to a signal fluctuation that indicates commencement of the coil energization signal by generating a pulse of short enough time duration to permit some contact closure arcing to occur if the circuit testing indicates that all is well and permits the relay coil to be energized to close the contacts.

14. A system in accordance with claim 13 wherein the circuit has two inputs, one from either coil terminal, such that it can always detect fluctuations of the coil energization signal regardless of which end of the coil may not be free to fluctuate in any given circuit configuration.

15. A system in accordance with claim 12 wherein the circuit has two inputs, one from either coil terminal, such that it can always detect fluctuations of the coil energization signal regardless of which end of the coil may not be free to fluctuate in any given circuit configuration.

16. An arc suppression system for a relay having at least one pair of normally open contacts, having an energizing coil with at least two leads, and having at least two contact terminals and two coil terminals respectively electrically coupled to each of the contacts and to each of the coil leads, said system comprising:

a solid state contact shorting switch having two switch leads connected in parallel to the two contact terminals and having a control lead which, when energized with an input signal, causes said switch to effectively short circuit the two contacts of the relay;

a timing pulse generator having two inputs receiving input signals respectively from both of the two coil terminals and responding to a signal fluctuation at either of the coil terminals in a direction indicating a cessation of an incoming relay energizing signal by causing conduction of the contact shorting switch of sufficient duration to suppress contact opening arcing.

17. A system in accordance with claim 16 wherein the timing pulse generator is designed to respond to signal fluctuations at either of the coil terminals in a direction indicating commencement of a relay energization signal by permitting at least a short duration of no arc suppression activity at contact closure time so that some amount of contact closure arcing is permitted to occur.

18. A system in accordance with claim 17 wherein the timing pulse generator is designed to respond to signal fluctuations at either of the coil terminals in a direction indicating commencement of a relay energization signal by momentarily causing the contact shorting switch to short the relay contacts, and wherein during this brief shorting of the relay contacts, other test circuits are called upon to test the integrity of the contact shorting switch and the coupling of its switch leads to the contact terminals by measuring the degree to which the contact shorting switch is able to short the relay contacts, the test circuit preventing actuation of the relay if there is any doubt about the ability of the contact shorting switch to suppress contact opening arcing.

19. A relay comprising:

a pair of normally-open relay contacts;

a pair of contact terminals electrically coupled to said respective relay contacts;

a relay coil magnetically coupled to at least one of said pair of relay contacts and arranged to close said pair of relay contacts when supplied with current, said coil having first and second leads;

a pair of coil terminals electrically coupled to said respective coil leads;

a solid state switch having a pair of switch leads electrically coupled to said respective contact terminals, said switch also having a control lead;

a timing circuit having first and second signal inputs and first and second power inputs and having a signal output electrically coupled to said switch control lead, said timing circuit providing a timed output signal pulse at its signal output in response to signal transitions at either of its signal inputs;

first and second electrical power couplings interconnecting said respective first and second power inputs to at least one of said coil or contact terminals, and at least one of said first and second electrical power couplings interconnecting the corresponding one of said first and second power supply inputs either to both of the coil terminals or to both of the contact terminals through diodes or their equivalents; and first and second signal supply couplings interconnecting said respective first and second signal inputs to said respective coil terminals to thereby permit said timing circuit to respond to signal fluctuations on either coil terminal.

20. A relay in accordance with claim 19 wherein said at least one of said first and second electrical power couplings interconnects the corresponding one of said first and second power supply inputs to both of the coil terminals.

21. A relay in accordance with claim 19 wherein said first electrical power coupling interconnects the first power supply input to both of the coil terminals through diodes or their equivalents, and wherein said second electrical power supply coupling interconnects the second power supply input to one of said contact terminals.

22. A relay comprising:

a pair of normally-open relay contacts;

first and second contact terminals electrically coupled to said respective relay contacts in said pair of contacts:

a relay coil magnetically coupled to at least one of said pair of relay contacts and arranged to close said pair of relay contacts when supplied with current, said coil having first and second leads;

first and second coil terminals, said first coil terminal electrically coupled to said first coil lead;

a first solid state switch electrically coupling said second coil lead to said second coil terminal and having a first control lead;

a second solid state switch having first and second switch leads and having a second control lead;

first and second contact terminal electrical couplings respectively connecting said first and second switch leads to said first and second contact terminals;

a timing circuit having first and second signal inputs and first and second power inputs and having a signal output electrically coupled to said second control lead, said timing circuit providing a timed output signal pulse at its signal output in response to signal transitions of a first polarity received at its first signal input and in response to signal transitions of a second polarity received at its second signal input;

first and second electrical power couplings connecting said respective first and second power inputs to at least one of said coil or contact terminals;

first and second signal supply couplings connecting said respective first and second signal inputs to said second coil terminal; and a circuit test electrical coupling connecting said second contact terminal to said first control lead, this circuit test electrical coupling being electrically isolated from said second contact terminal electrical coupling such that a test signal flowing from said second switch lead of said second solid state switch to said first control lead of said first solid state switch must pass into and out of said second contact terminal.

23. A relay in accordance with claim 22 wherein said first contact terminal extends from the relay and is intended to connect to some source of external load supply voltage, and said second contact terminal extends from the relay and is intended to connect to some form of external load.

24. A relay in accordance with claim 22 wherein said first coil terminal extends from the relay and is intended to connect to some source of external coil supply voltage, and said second coil terminal extends from the relay and is intended to receive some form of external relay actuation signal.

25. A relay in accordance with claim 24 wherein said first contact terminal extends from the relay and is intended to connect to some source of external load supply voltage, and said second contact terminal extends from the relay and is intended to connect to some form of external load.

26. A relay in accordance with claim 22 which includes:

a printed circuit board having openings through which all of said terminals extend; and wherein at least one of said electrical interconnection between said first and second switches and said contact and coil terminals is formed by foil current path formed on the surface of said printed circuit board and electrically engaging at least one of said first and second contact terminals or said second coil terminal.

27. A relay in accordance with claim 26 in which the electrical coupling between said second coil lead and said first solid state switch comprises:

a third shortened coil terminal electrically coupled to said second coil lead and electrically coupled by foil on said circuit board to said first solid state switch.

28. A relay in accordance with claim 26 wherein said first contact terminal extends from the relay and is intended to connect to some source of external load supply voltage, and said second contact terminal extends from the relay and is intended to connect to some form of external load and wherein said first and second contact terminals are electrically coupled by foil on said circuit board to said second solid state switch.

29. A relay in accordance with claim 26 wherein said first coil terminal extends from the relay and is intended to connect to some source of external coil supply voltage, and said second coil terminal extends from the relay and is intended to receive some form of external relay actuation signal, and wherein said second coil terminal is electrically coupled by foil on said circuit board to said first solid state switch.

30. A relay in accordance with claim 29 wherein said first contact terminal extends from the relay and is intended to connect to some source of external load supply voltage, and said second contact terminal extends from the relay and is intended to connect to some form of external load, and wherein said first and second contact terminals are electrically coupled by foil on said circuit board to said second solid state switch.

31. A relay in accordance with claim 26 wherein said terminals include shoulders against which said printed circuit board and, if present, any circuit board supporting structure rests.

32. A relay in accordance with claim 31 wherein said terminals include stakable portions which, when staked, lock said circuit board and, if present, any circuit board supporting structure in between said shoulder and said stakable portion.

33. A relay in accordance with claim 26 wherein said terminals include stakable portions which, when staked, lock said circuit board and, if present, any circuit board supporting structure in place between said stakable portions and other portions of said relay.

34. A relay in accordance with claim 26 wherein all of said electrical interconnections between said first and second switches and said contact and coil terminals is formed by foil current paths formed on the surface of said printed circuit board and electrically engaging said first and second contact terminals and said second coil terminal.

35. A relay in accordance with claim 22 which further includes:
   a current conductive element electrically coupling said second coil lead to said second coil terminal.

36. A relay in accordance with claim 22 wherein said current conductive element is a resistor.

37. A relay in accordance with claim 22 wherein the first and second signal inputs to said timing circuit feed their respective signals through resistive-capacitive timing circuits to inverting transistor amplifiers, wherein the output signal of one of said transistor amplifiers is inverted, and wherein the outputs of both said transistor amplifiers are electrically coupled to the second control lead of said second solid state switch.

38. A relay in accordance with claim 22 wherein the first and second signal inputs to said timing circuit feed their respective signals through resistive-capacitive timing circuits to transistor amplifiers, an inverting transistor amplifier in the case of the first signal input and a non-inverting amplifier in the case of the second signal input, and wherein the outputs of both transistor amplifiers are electrically coupled to the second control lead of said second solid state switch.

39. A relay in accordance with claim 37 wherein the electrical coupling between at least one of said transistor amplifiers and said second control lead includes a diode.

* * * * *